United States Patent
Wallace et al.

(10) Patent No.: US 10,515,300 B2
(45) Date of Patent: Dec. 24, 2019

(54) HIGH SPEED SERIAL LINKS FOR HIGH VOLUME MANUFACTURING

(71) Applicant: DELL PRODUCTS, LP, Round Rock, TX (US)

(72) Inventors: Douglas E. Wallace, Round Rock, TX (US); Bhyrav M. Mutnury, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 590 days.

(21) Appl. No.: 15/278,572

(22) Filed: Sep. 28, 2016

(65) Prior Publication Data

US 2018/0089560 A1    Mar. 29, 2018

(51) Int. Cl.
*G06N 3/02* (2006.01)
*G06F 17/50* (2006.01)

(52) U.S. Cl.
CPC ........... *G06N 3/02* (2013.01); *G06F 17/5036* (2013.01)

(58) Field of Classification Search
CPC ... G06F 17/5009; G06F 17/5036; G06N 3/02; G06N 3/08; H04N 13/111; H04N 13/161; H04N 13/194; H04N 19/172; H04N 19/182; H04N 19/46; H04N 19/597; H04N 19/61; H04N 19/70; H04N 2213/003; Y04S 10/54

See application file for complete search history.

(56) References Cited

U.S. PATENT DOCUMENTS 6,968,300 B2   11/2005   Wallace, Jr.
2014/0326495 A1   11/2014   Paniagua

OTHER PUBLICATIONS

Beyene, "Application of Artificial Neural Networks to Statistical Analysis and Nonlinear Modeling of High-Speed Interconnect Systems", IEEE Transactions on Computer-Aided Design of Integrated Circuits and Systems, vol. 26, No. 1, Jan. 2007 (Year: 2007).*
ASPOCOMP, "Controlled Impedance in PCB Manufacturing", Oulu PCB Seminar 2015 (Year: 2015).*

* cited by examiner

*Primary Examiner* — Li B. Zhen
*Assistant Examiner* — Selene A. Haedi
(74) *Attorney, Agent, or Firm* — Larson Newman, LLP

(57) ABSTRACT

An information handling system includes a memory that stores code, and a processor that executes code stored in memory to derive a distribution of impedances for parameters of a trace within a printed circuit board (PCB). The processor further to determine impedance corners of the distribution of impedances, to select the impedance corners as first, second, and third trace models, and to derive first, second, and third distribution of losses based on the first, second, and third trace models. The processor further to store loss corners of the first, second, and third distribution of losses as modeling points, and to determine whether all of modeling points pass within tolerance levels of loss and impedance of the trace.

20 Claims, 5 Drawing Sheets

HIGH SPEED SERIAL LINKS FOR HIGH VOLUME MANUFACTURING

FIELD OF THE DISCLOSURE

This disclosure generally relates to information handling systems, and more particularly relates to high speed serial links for high volume manufacturing.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A method can include deriving, by an Artificial Neural Network (ANN), a distribution of impedances of a trace within a printed circuit board (PCB) based on input parameters for the trace. The method also includes determining first, second, and third impedance corners of the distribution of impedances. The method further includes selecting the first impedance corner as a first trace model, the second impedance corner as a second trace model, and the third impedance corner as a third trace model. The method also includes deriving, by the ANN, a first distribution of losses and impedance values based on the first trace model, a second distribution of losses and impedance values based on the second trace model, and a third distribution of losses and impedance values based on the third trace model. The method further includes storing loss corners of the first, second, and third distribution of losses as modeling points. The method also includes determining whether all of the modeling points pass within tolerance levels of impedance and manufacturing parameter values for the trace. The method further includes building the PCB based on parameters defined in the modeling points in response to all of the model points passing within the tolerance levels

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
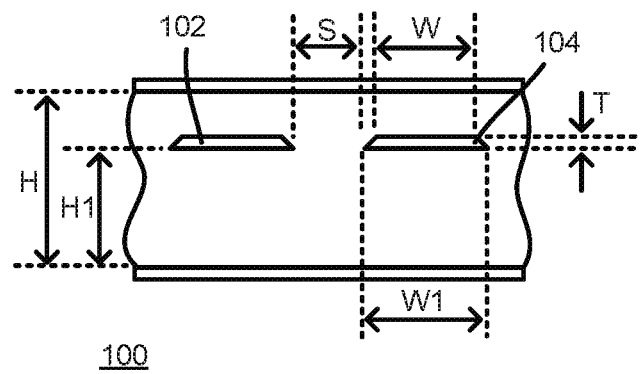
FIG. 1 is a cutaway view of a printed circuit board and circuit traces according to an embodiment of the present disclosure.

FIG. 1 illustrates an embodiment of a printed circuit board (PCB) 100 of an information handling system. For the purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

The PCB 100 includes multiple traces for high speed serial links, such as traces 102 and 104. Each of the traces 102 and 104 can have different parameters, such as trace width at the top of the trace (W), trace width at the bottom of the trace (W1), separation between traces (S), thickness of the trace (T), distance from a bottom of a substrate to the bottom of the trace (H1), and the thickness of the substrate (H). Variations in these parameters W, W1, S, T, H1, H, and other parameters can cause impedance and loss of the traces 102 and 104 to differ. The PCB 100 and other similar PCBs can be manufactured using high volume manufacturing (HVM), which can cause a variation of 10-15% of parameters from one PCB to the next.

A design or model for traces of a high speed serial link in PCB 100 may identify values of parameters of the trace that result in the impedance and loss of the trace being within a tolerance level. However, manufacturing of PCB 100 produced by high volume manufacturing (HVM) can cause variations from one PCB to the next. Thus, not all of the traces on all of the PCBs manufactured by HVM may be within the tolerance level based on the variations due to HVM. Thus, models or simulations of how the parameters of the traces 102 and 104 can affect the impedance and loss of the traces may be helpfully for implementing HVM of PCB 100. Present practice is to make a nominal model for a target impedance value, then to adjust input parameters, such as W, S, T and H, to get a minimum of three impedance values (low, optimal, and high). This modeling may also use an ad-hoc manual method of adjusting the mechanical parameters, then running a 2D field solver iteratively until a target low and high impedance value is obtained. However, in high speed systems above 8 Gb/s, it may be beneficial to also obtain the loss corners to get a minimum nine points for the trace models, three impedance values, and three loss values. These nine points can be model quickly via use of an Artificial Neural Network (ANN) 200 of FIG. 2.

Figure 2:
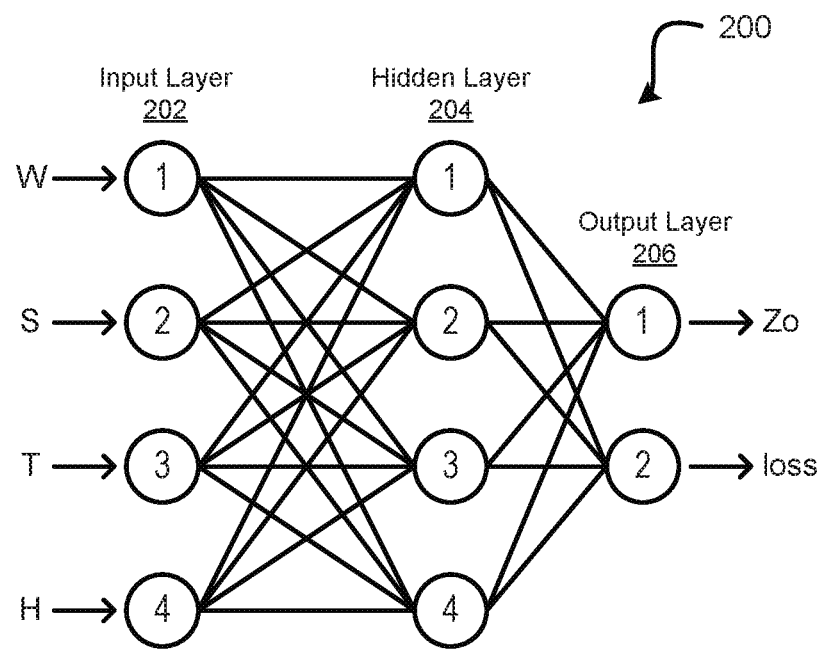
FIG. 2 is an illustration of an Artificial Neural Network for evaluating the design of circuit traces in a printed circuit board for high speed communications according to an embodiment of the present disclosure.

FIG. 2 illustrates the ANN 200 for evaluating the design of circuit traces in a printed circuit board for high speed communications according to an embodiment of the present disclosure. In a particular embodiment, the ANN 200 is trained to learn an output formula that relates design parameters W, S, T and H to the output parameters of impedance and loss of the trace, such as traces 102 and 104. While the traces 102 and 104 can have a range of parameters, such as 13-17 variables, that affect the impedance of loss of the traces, for clarity and brevity only parameters W, S, T and H discussed herein. However, the modeling of parameters W, S, T and H can be applied to all of the parameters of traces 102 and 104 without deviating from this disclosure. An input layer 202 including design parameters W, S, T and H is provided, and sets of the design parameter values are analyzed through a hidden layer 204 to provide a learned formula for each of the output parameters in an output layer 206. Each output parameter can be considered to be modeled by a separate 4 nodes to 1 hidden layer neural network (4-1 neural network) with an output given as:

$$y = f(x) = \sum_{j=1}^{M} k_j * G(\sum_{i=1}^{N} w_{ij} x_i + b_j) + d \quad \text{Equation 1}$$

$$G(x) = 2/1 + e^{-2x} - 1 \quad \text{Equation 2}$$

where N is the number of inputs, M is the number of hidden nodes, x is the input vector, $w_{ij}$ is the weight connecting the $i^{th}$ input layer node to the $j^{th}$ node, d is a constant to make the equation stable, and $k_j$ is the weight connecting the $j^{th}$ hidden layer node to the output layer node. It will be understood that the design of ANN 200 can be chosen to optimize the modeling behavior, and that the number of hidden layers can be greater than one (1), and that the number of nodes in a particular hidden layer is not necessarily equal to four (4) nodes, but can have a greater or lesser number of hidden layer nodes as needed or desired. Moreover, the interconnections between the nodes can be chosen as needed or desired to reflect the interactions between the input parameters and the output parameters.

In a particular embodiment, a d-optimal training algorithm is utilized in ANN 200 to intelligently reduce the number of sets of the design parameter values that are utilized to train the ANN. Here, ANN 200 is trained so as to maximize the determinant of the information matrix (X'X). An optimum number of sets of the design parameters can be chosen to train ANN 200, such as 100, 200, 300, or the like. In another embodiment, another training algorithm is utilized in in ANN 200 to intelligently reduce the number of sets of the design parameter values that are utilized to train the ANN. An example of other training algorithms include Radial Basis Functions (RBF), Surrogate Learning Models, Regression Models, or other training algorithms, as needed or desired.

Figures 3, 4:
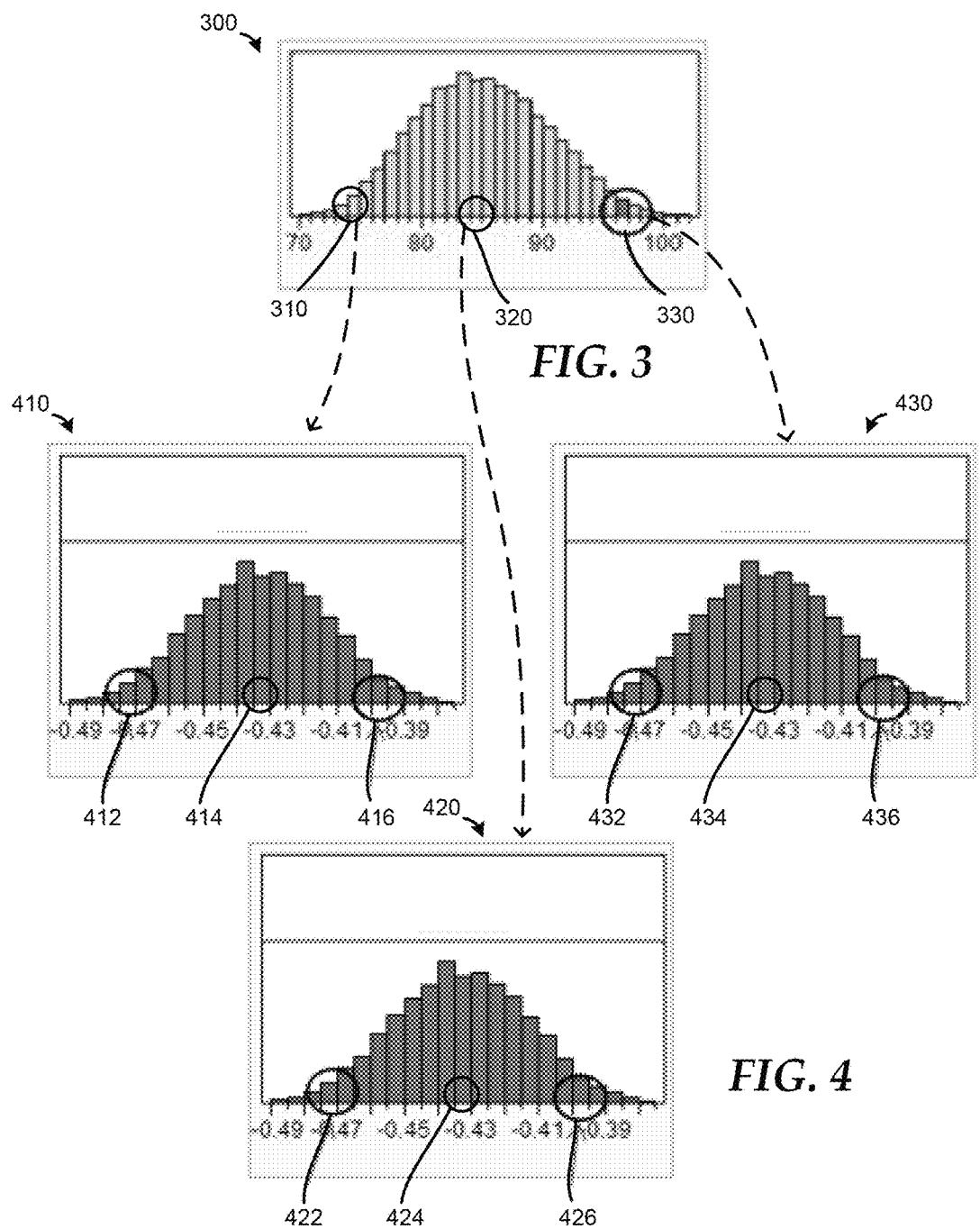
FIG. 3 is an illustration of a distribution of impedance models for a printed circuit board generated by the Artificial Neural Network according to an embodiment of the present disclosure.
FIG. 4 is an illustration of a three distributions of loss models for a printed circuit board generated by the Artificial Neural Network based on the distribution of impedance models in FIG. 3 according to an embodiment of the present disclosure.
Figure 5:
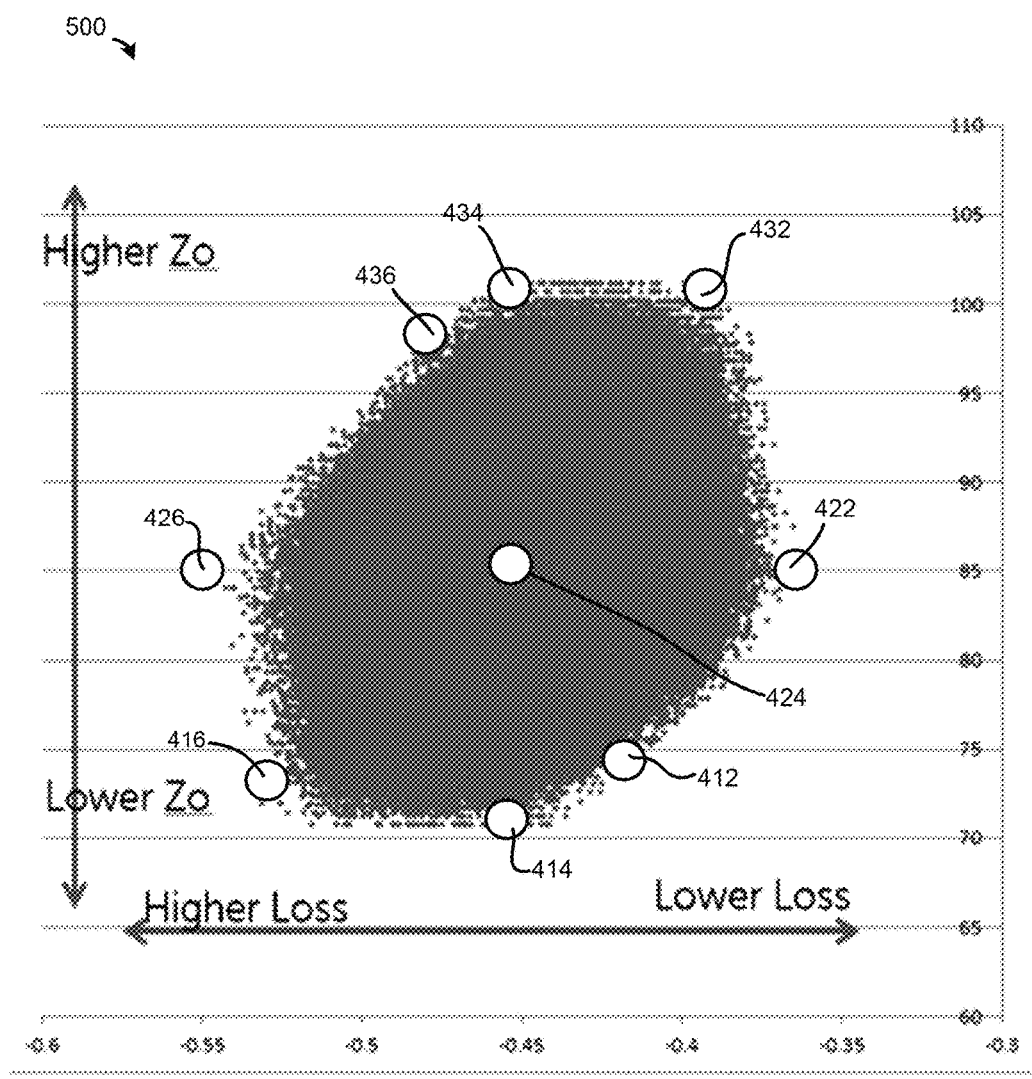
FIG. 5 is an illustration of a constellation plot of loss versus impedance according to an embodiment of the present disclosure.

The operation of the ANN 200 will be discussed with reference to FIGS. 3-5. FIG. 3 illustrates a distribution of impedance models 300 for a printed circuit board generated by the ANN 200 according to an embodiment of the present disclosure. FIG. 4 illustrates three distributions of loss models 410, 420, and 430 for a printed circuit board generated by the ANN 200 based on the distribution of impedance models in FIG. 3 according to an embodiment of the present disclosure. FIG. 5 illustrates of a constellation plot 500 of loss versus impedance according to an embodiment of the present disclosure.

Once the ANN 200 is trained to the parameter values W, S, T and H, the ANN 200 can be utilized to model parameters for the traces that cause the impedance and loss of the traces to remain within a tolerance level. The ANN 200 can run to derive a distribution of impedances for multiple models of a trace, such as trace 102 or 104 of the PCB 100, based on the knowledge the ANN obtained during the training. In an embodiment, ANN 200 can execute a large number of models for impedances, such as 100,000; 200,000; 500,000; or the like, in a short amount of time. The ANN 200 can then provide the resulting impedance models as a distribution of impedance models as illustrated in FIG. 3. In an embodiment, the ranges of impedances in the distribution of impedance models can be plotted as histograms with typically 20 to 30 groups or bins of the same impedance value spread across the X-axis, which represents the impedance value, as shown in FIG. 3. The height of each bin is related to the number of results for that bin. In an embodiment, these histograms may have a Gaussian shape.

A subset 310 of the data in the distribution of impedances 300 can be selected as a target low impedance of the trace 102 or 104, another subset 320 of this data can be selected as a target nominal impedance, and another subset 330 of this data can be selected as a target high impedance. In an embodiment, the nominal subset of impedances 320 can be the middle group or bin, and the low and high subsets 310 and 330 can be a bin that is located a particular distance from the middle, such as minus or plus 3 sigma location. The ANN 200 can then derive loss distributions based on each of the subsets 310, 320, and 330. For example, the low impedance subset 310 can be utilized as a trace model in the ANN 200 to generate a distribution of losses model 410, shown in FIG. 4. Similarly, the ANN 200 can use the nominal impedance subset 320 as a trace model to generate a distribution of losses model 420, shown in FIG. 4. The ANN 200 can then use the high impedance subset 330 as a trace model to generate a distribution of losses model 420, shown in FIG. 4.

A subset 412 of the data in the distribution of losses model 410 can be selected as a target low loss for a low impedance subset of the trace 102 or 104, another subset 414 of this data can be selected as a target nominal loss for the low impedance subset, and another subset 416 of this data can be selected as a target high loss for the low impedance subset. In an embodiment, the high loss, low loss, and nominal loss can be defined as corners of the distribution of losses 410. A subset 422 of the data in the distribution of losses model 420 can be selected as a target low loss for a nominal impedance subset of the trace 102 or 104, another subset 424 of this data can be selected as a target nominal loss for the nominal impedance subset, and another subset 426 of this data can be selected as a target high loss for the nominal impedance subset. Similarly, a subset 432 of the data in the distribution of losses model 430 can be selected as a target low loss for a high impedance subset of the trace 102 or 104, another subset 434 of this data can be selected as a target nominal loss for the high impedance subset, and another subset 436 of this data can be selected as a target high loss for the high impedance subset. The loss subsets 412, 414, 416, 422, 424, 426, 432, 434, and 436 of distribution of losses 410, 420, and 430 can then be stored as modeling points for the parameters of trace 102 or 104 of PCB 100.

These modeling points 412, 414, 416, 422, 424, 426, 432, 434, and 436 can then be plotted on the constellation plot 500 of loss versus impedance shown in FIG. 5. A determination can then be made whether all of the modeling points 412, 414, 416, 422, 424, 426, 432, 434, and 436 are within the tolerance level for impedance and loss of trace 102 or 104 of PCB 100. If so, PCB 100 can be built based on parameters defined in the modeling of the ANN 200. Otherwise, if even one of the modeling points 412, 414, 416, 422, 424, 426, 432, 434, and 436 is outside the tolerance level of either or both of impedance and loss for trace 102 or 104, then modeling fails and the PCB 100 is not built because the HVM of PCB 100 would result in one or more PCBs with traces that do not have impedance and/or loss values within the predefined tolerance levels.

Figure 6:
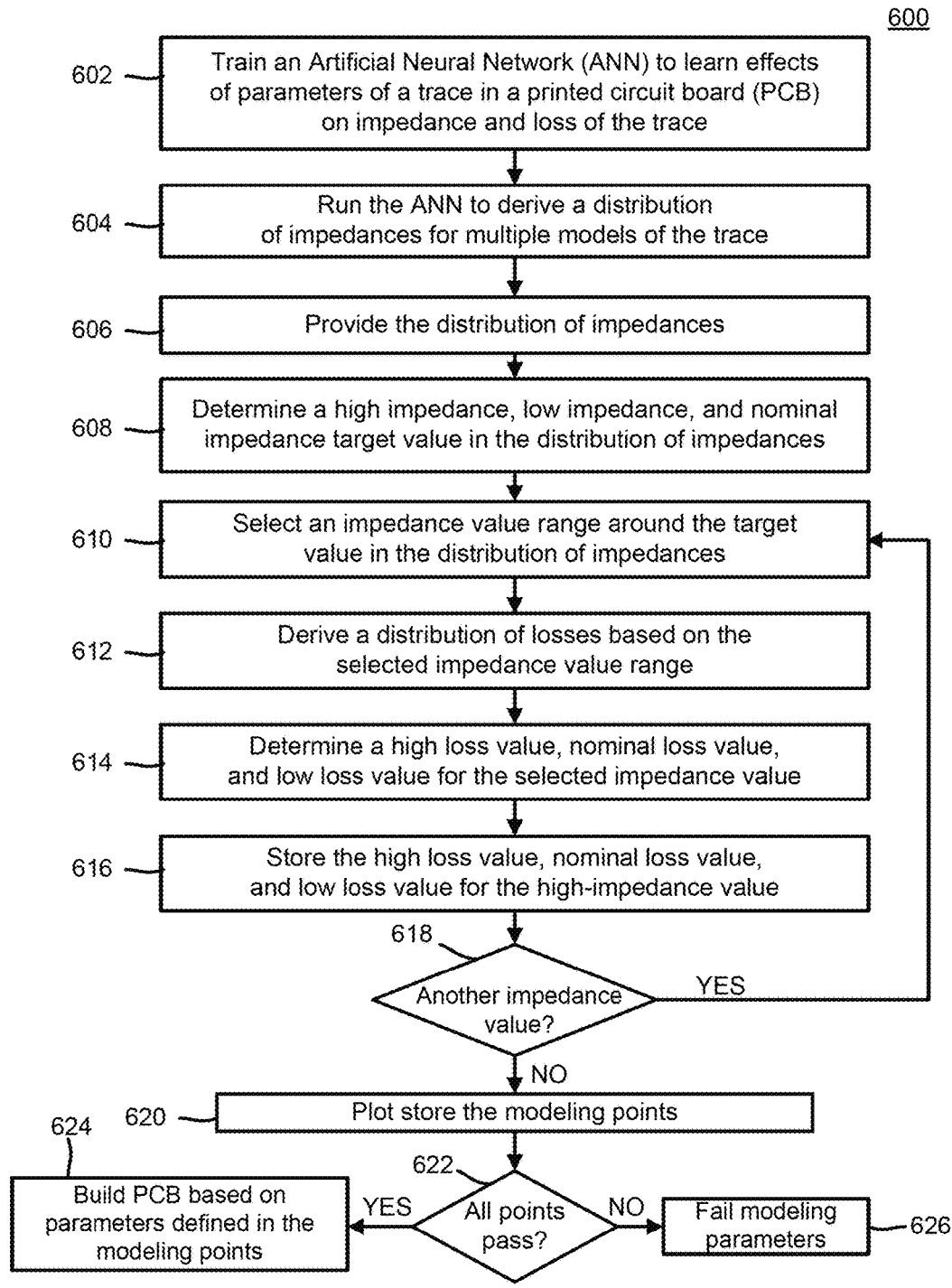
FIG. 6 is a flowchart illustrating a method for deriving parameters for traces on a printed circuit board that keep impedance and loss of the trace within a tolerance level with manufacturing variation according to an embodiment of the present disclosure.

FIG. 6 illustrates a method 600 for deriving parameters for traces on a printed circuit board that keep impedance and loss of the trace within a tolerance level with manufacturing variation according to an embodiment of the present disclosure. At block 602, an Artificial Neural Network (ANN) is trained to learn effects of parameters of a trace in a printed circuit board on impedance and loss of the trace. In an embodiment, the training of the ANN can be based on a predetermined number of simulations of trace parameters, such as 100, 200, 300, or the like. The ANN is run to derive a distribution of impedances for multiple models of the trace of the PCB at block 604. In an embodiment, the number of models can be any amount, such as 100,000; 200,000; 500,000; or the like. In an embodiment, these models can be a main set of models from which subsets for further analysis can be derived. In an embodiment, the large number of models in this set can be used to ensure enough models will remain in the subdivided subsets to be statistically sufficient.

At block 606, a distribution of the impedances is provided. In an embodiment, the distribution of impedances can be divided in different groups or bins, and each bin can have a different number of results. In an embodiment, the distribution of impedances can have a Gaussian shape. A high impedance bin, a low impedance bin, and a nominal impedance bin of the distribution are determined at block 608. In an embodiment, the high impedance, low impedance, and nominal impedance can target impedance values for traces in a PCB. In an embodiment, the high impedance, low impedance, and nominal impedance can be defined as corners of the distribution of impedances. In an embodiment, the high impedance and low impedance can be a predetermined location from the nominal or central bin, such as a 3 sigma location. A first impedance value or bin is selected around a target value at block 610. In an embodiment, each of the determined impedance bins can be selected in turn, such that the first impedance bin selected is the high impedance bin, the second impedance bin selected is the nominal impedance bin, and the third impedance bin selected is the low impedance bin.

At block 612, distribution of losses is derived from a subset, or bin, based on the selected impedance value range. A high loss value, a nominal loss value, and a low loss value are determined from the loss distribution derived based on the selected impedance at block 614. In an embodiment, the high loss, low loss, and nominal loss can be defined as corners of the distribution of losses. The high loss value, the nominal loss value, and the low loss value for the selected impedance are stored as modeling points for the PCB at block 616. At block 618, a determination is made whether another impedance value in the impedance distribution is available.

If another impedance value is available, the flow continues as stated above at block 610. If another impedance value is not available, the flow continues at block 620 and the stored modeling points are plotted on a loss versus impedance plot. At block 622, a determination is made whether all of the model points are located with a predefined tolerance for the PCB. If all of the model points pass within the predefined tolerance, the PCB is built based on the parameters defined by the modeling points at block 624. Otherwise, if all of the model points do not pass within the predefined tolerance, the modeling fails at block 626.

Figure 7:
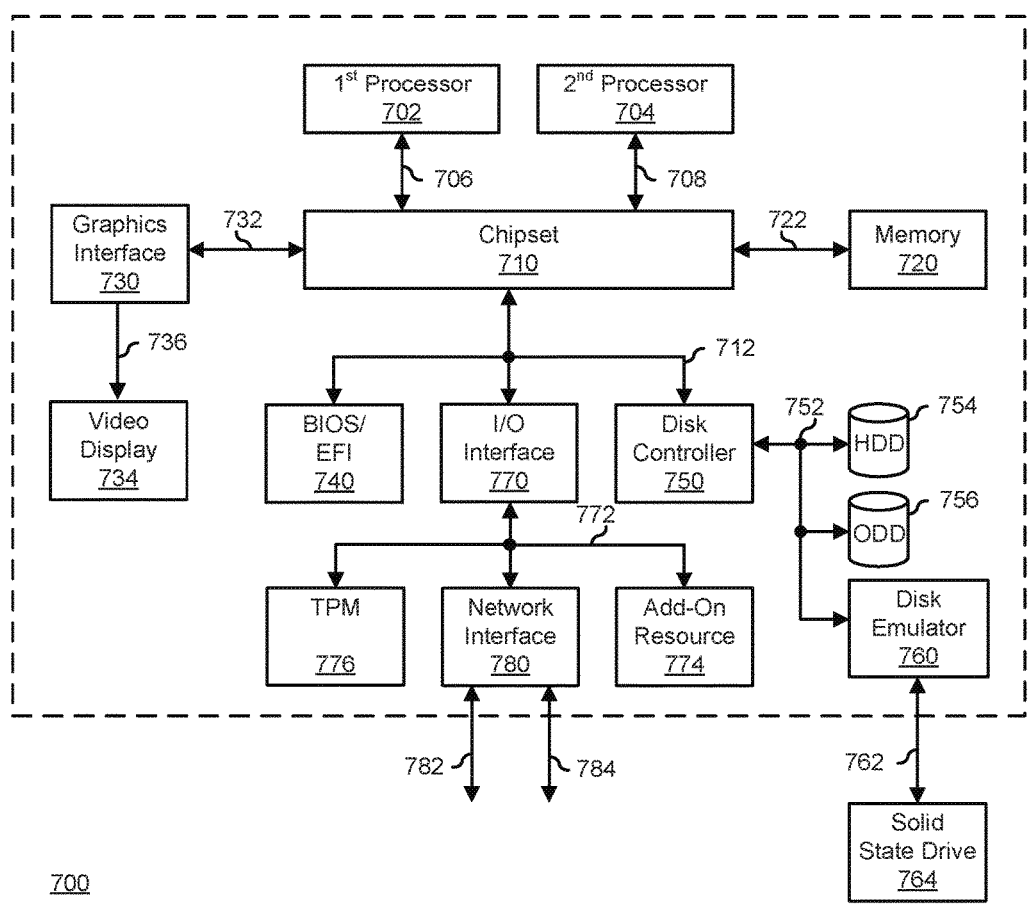
FIG. 7 is a block diagram illustrating a generalized information handling system according to an embodiment of the present disclosure.

FIG. 7 illustrates a generalized embodiment of information handling system 700. For purpose of this disclosure information handling system 700 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described above, and operates to perform one or more of the methods described above. Information handling system 700 includes a processors 702 and 704, a chipset 710, a memory 720, a graphics interface 730, include a basic input and output system/extensible firmware interface (BIOS/EFI) module 740, a disk controller 750, a disk emulator 760, an input/output (I/O) interface 770, and a network interface 780. Processor 702 is connected to chipset 710 via processor interface 706, and processor 704 is connected to the chipset via processor interface 708. Memory 720 is connected to chipset 710 via a memory bus 722. Graphics interface 730 is connected to chipset 710 via a graphics interface 732, and provides a video display output 736 to a video display 734. In a particular embodiment, information handling system 700 includes separate memories that are dedicated to each of processors 702 and 704 via separate memory interfaces. An example of memory 720 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 740, disk controller 750, and I/O interface 770 are connected to chipset 710 via an I/O channel 712. An example of I/O channel 712 includes a Peripheral Component Interconnect (PCI) interface, a PCI-Extended (PCI-X™) interface, a high-speed PCI-Express (PCIe®) interface, another industry standard or proprietary communication interface, or a combination thereof. Chipset 710 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 740 includes BIOS/EFI code operable to detect resources within information handling system 700, to provide drivers for the resources, initialize the resources, and access the resources. BIOS/EFI module 740 includes code that operates to detect resources within information handling system 700, to provide drivers for the resources, to initialize the resources, and to access the resources.

Disk controller 750 includes a disk interface 752 that connects the disc controller to a hard disk drive (HDD) 754, to an optical disk drive (ODD) 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits a solid-state drive 764 to be connected to information handling system 700 via an external interface 762. An example of external interface 762 includes a USB interface, an IEEE 1394 (Firewire) interface, a proprietary interface, or a combination thereof. Alternatively, solid-state drive 764 can be disposed within information handling system 700.

I/O interface 770 includes a peripheral interface 772 that connects the I/O interface to an add-on resource 774, to a TPM 776, and to network interface 780. Peripheral interface 772 can be the same type of interface as I/O channel 712, or can be a different type of interface. As such, I/O interface 770 extends the capacity of I/O channel 712 when peripheral interface 772 and the I/O channel are of the same type, and the I/O interface translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as chipset 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes INFINIBAND® channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
 deriving, by an Artificial Neural Network (ANN), a distribution of impedances of a trace within a printed circuit board (PCB) based on input parameters for the trace;
 determining first, second, and third impedance corners of the distribution of impedances;
 selecting, by the ANN, the first impedance corner as a first trace model, the second impedance corner as a second trace model, and the third impedance corner as a third trace model;
 deriving, by the ANN, a first distribution of losses based on the first trace model, a second distribution of losses based on the second trace model, and a third distribution of losses based on the third trace model;
 storing loss corners of the first, second, and third distribution of losses as modeling points;
 determining whether all of the modeling points pass within tolerance levels of loss impedance values for the trace; and
 building the PCB based on parameters of the trace defined in the modeling points in response to all of the model points passing within the tolerance levels.

2. The method of claim 1, further comprising:
 training the ANN prior to deriving the distribution of impedances by the ANN.

3. The method of claim 1, further comprising:
 plotting the modeling points on a loss versus impedance plot.

4. The method of claim 1, further comprising:
 providing the distribution of impedances prior to determining first, second, and third impedance corners of the distribution of impedances.

5. The method of claim 1, wherein the distribution of impedances is divided in different bins, and each bins has a different number of results.

6. The method of claim 1, wherein the high impedance and the low impedance are a predetermine location away from the nominal impedance within the distribution of impedances.

7. The method of claim 1, wherein the training of the ANN utilizes a fewer number of simulations than a number of simulations utilized to derive the distribution of impedances.

8. A non-transitory computer-readable medium including code for performing a method, the method comprising:
 deriving, by an Artificial Neural Network (ANN), a distribution of impedances of a trace within a printed circuit board (PCB) based on input parameters for the trace;
 determining first, second, and third impedance corners of the distribution of impedances;
 selecting, by the ANN, the first impedance corner as a first trace model, the second impedance corner as a second trace model, and the third impedance corner as a third trace model;
 deriving, by the ANN, a first distribution of losses based on the first trace model, a second distribution of losses based on the second trace model, and a third distribution of losses based on the third trace model;
 storing loss corners of the first, second, and third distribution of losses as modeling points;
 determining whether all of the modeling points pass within tolerance levels of loss impedance values for the traces; and
 building the PCB based on ammeters of the trace defined in the modeling points in response to all of the model to all model points passing within the tolerance levels.

9. The computer-readable medium of claim 8, wherein the PCB is built based on parameters defined in the modeling points in response to all of the model points passing within the tolerance levels.

10. The computer-readable medium of claim 8, the method further comprising:
 training the ANN prior to deriving the distribution of impedances by the ANN.

11. The computer-readable medium of claim 8, further comprising:
 plotting the modeling points on a loss versus impedance plot.

12. The computer-readable medium of claim 8, further comprising:
 providing the distribution of impedances prior to determining first, second, and third impedance corners of the distribution of impedances.

13. The computer-readable medium of claim 8, wherein the distribution of impedances is divided in different bins, and each bins has a different number of results.

14. The computer-readable medium of claim 8, wherein the high impedance and the low impedance are a predetermine location away from the nominal impedance within the distribution of impedances.

15. An information handling system comprising:
 a memory; and
 a processor that executes code stored in memory to:
  derive by an Artificial Neural Network ANN), a distribution of impedances of a trace within a printed circuit board (PCB) based on input parameters for the trace;
  determine first, second, and third impedance corners of the distribution of impedances;
  select, by the ANN, the first impedance corner as a first trace model, the second impedance corner as a second trace model, and the third impedance corner as a third trace model;
  derive, by the ANN, a first distribution of losses based on the first trace model, a second distribution of losses based on the second trace model, and a third distribution of losses based on the third trace model;
  store loss corners of the first, second, and third distribution of losses as modeling, points;
  determine whether all of the modeling points pass within tolerance levels of loss impedance values for the trace; and
  build the PUB based on parameters of the trace defined in the modeling points in response to all of the model points passing within the tolerance levels.

16. The information handling system of claim 15, wherein the PCB is built based on parameters defined in the modeling points in response to all of the model points passing within the tolerance.

17. The information handling system of claim 15, the processor further to:
 plot the modeling points on the loss versus impedance plot.

18. The information handling system of claim 15, the processor further to:
 provide the distribution of impedances prior to determining first, second, and third impedance corners of the distribution of impedances.

19. The information handling system of claim 15, wherein the distribution of impedances is divided in different bins, and each bins has a different number of results.

20. The information handling system of claim 15, wherein the high impedance and the low impedance are a predetermine location away from the nominal impedance within the distribution of impedances.

\* \* \* \* \*